United States Patent [19]
Chern et al.

[11] Patent Number: 5,834,068
[45] Date of Patent: *Nov. 10, 1998

[54] WAFER SURFACE TEMPERATURE CONTROL FOR DEPOSITION OF THIN FILMS

[75] Inventors: Chyi Chern, Saratoga, Calif.; Wei Chen, Hsin-chu, Taiwan; Marvin Liao, San Jose, Calif.; Jennifer Meng Chu Tseng; Mei Chang, both of Saratoga, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 682,844

[22] Filed: Jul. 12, 1996

[51] Int. Cl.$^6$ ..................................................... C23C 16/52
[52] U.S. Cl. .................. 427/535; 427/248.1; 427/255.2; 427/314; 427/374.2; 438/680; 438/681; 438/758
[58] Field of Search .............................. 427/248.1, 255.2, 427/535, 314, 374.2; 438/680, 681, 758

[56] References Cited

U.S. PATENT DOCUMENTS

| | | | |
|---|---|---|---|
| 5,030,476 | 7/1991 | Okamura et al. | 427/39 |
| 5,113,929 | 5/1992 | Makagawa et al. | 165/61 |
| 5,124,179 | 6/1992 | Garg et al. | 427/249 |
| 5,279,865 | 1/1994 | Chebi et al. | 427/574 |
| 5,470,619 | 11/1995 | Ahn et al. | 427/578 |
| 5,576,071 | 11/1996 | Sandhu | 427/534 |

OTHER PUBLICATIONS

Baushah et al., *Deposition Technologies For Films and Coatings*, Noyes Publications, Park Ridge, NJ, (1982) pp. 365–366 (no month).

*Primary Examiner*—Shrive Beck
*Assistant Examiner*—Timothy Meeks
*Attorney, Agent, or Firm*—Thomason and Moser

[57] ABSTRACT

A method for improving the characteristics of deposited thin films by improved control and stabilization of wafer surface temperatures. Further, the invention provides the ability to rapidly change the temperature of the wafer surface without the need to change the temperature of the chamber. The wafer is heated to an operating temperature by conventional means. A gas with high thermal conductivity, such as helium or hydrogen, is passed over the wafer to cool its surface to a desired temperature for the process to be performed. The flow rate is then adjusted to stabilize the temperature of the wafer and reduce surface temperature variations. Processing gases are then introduced into the chamber, and deposition onto the wafer commences. The maintenance of correct wafer surface temperature results in improved step coverage and conformality of the deposited film. Post-deposition steps such as plasma annealing may be performed using a gas compatible with the process at a flow rate which results in a temperature desirable for the post-deposition process.

14 Claims, 11 Drawing Sheets

*Fig. 4*    Time:188s

Table 1: 2-cycle CVD TiNxP Process Recipe Table

200mm CVD TiNxP 450C BKM-6/V.1.5 Hardware

| Step | 1 | 2 | 3 | 4 | 5 | 6 | 7 | 8 | 9 | 6 | 7 | 8 | 9 | 14 | 15 |
|---|---|---|---|---|---|---|---|---|---|---|---|---|---|---|---|
| Name | Pump | Gas On | Heat | Heat-Up | Set TV | Set Flow | Dep | Pre-Plasma | Plasma | Set Flow | Dep | Pre-Plasma | Plasma | Purge | Pump |
| Time (s) | 3 | 3 | 3 | 20 | 3 | 20 | 15 | 5 | 35 | 20 | 15 | 5 | 35 | 3 | 3 |
| Pressure (Torr) | TVO | TVO | TV 240 | 5 | TV 390 | 1.2 | 1.2 | 1.1 | 1.1 | 1.2 | 1.2 | 1.1 | 1.1 | TVO | TVO |
| Temp (C) | 450 | 450 | 450 | 450 | 450 | 450 | 450 | 450 | 450 | 450 | 450 | 450 | 450 | 450 | 450 |
| RF Power (W) | 0 | 0 | 0 | 0 | 0 | 0 | 0 | 0 | 350 | 0 | 0 | 0 | 350 | 0 | 0 |
| TDMAT/He (sccm) | 0 | 0 | 0 | 0 | 0 | 0 | 200 | 0 | 0 | 0 | 200 | 0 | 0 | 0 | 0 |
| He (sccm) | 0 | 0 | 0 | 0 | 0 | 0 | 200 | 0 | 0 | 0 | 0 | 0 | 0 | 0 | 0 |
| N2 (sccm) | 0 | 500 | 500 | 500 | 800 | 800 | 0 | 600 | 600 | 0 | 0 | 600 | 600 | 500 | 0 |
| H2 (sccm) | 0 | 500 | 500 | 500 | 0 | 0 | 0 | 600 | 600 | 0 | 0 | 600 | 600 | 0 | 0 |
| Ar (sccm) | 0 | 0 | 0 | 0 | 0 | 0 | 0 | 0 | 0 | 0 | 0 | 0 | 0 | 1000 | 0 |
| Ar-Purge (sccm) | 0 | 400 | 400 | 400 | 400 | 400 | 400 | 0 | 0 | 400 | 400 | 0 | 0 | 500 | 0 |
| Spacing (mils) | 450 | 450 | 450 | 450 | 450 | 450 | 450 | 450 | 450 | 450 | 450 | 450 | 450 | 450 | 450 |

Fig. 5 (Temperature dependence of thermal conductivity of $H_2$, $N_2$, Ar, and He)

Fig. 6(a)

STEP COVERAGE DEPENDENCE ON GASEOUS SPECIES IN PROCESS STEPS

| PRE-DEPOSITION (SET FLOW) GAS FLOW (sccm) | TDMAT CARRIER FLOW (sccm) | DILUENT GAS FLOW (sccm) | STEP COVERAGE |
|---|---|---|---|
| 400 N2 | 150 He | 350 N2 | 30-35% |
| 400 N2 | 200 He | 200 N2 | 40-45% |
| 800 N2 | 200 He | 200 N2 | 65-75% |
| 800 H2 | 200 He | 200 H2 or 200 He | 75-80% |
| 800 He | 200 He | 200 H2 or 200 He | 75-80% |
| 1600 H2 | 200 He | 200 H2 or 200 He | 80-85% |
| 1600 H2 | 300 He | 100 H2 | 82-90% |

Fig. 6(b)

CROSS-SECTION SEM MICROGRAPH OF TiNxP FILMS
WITH 80% BOTTOM STEP COVERAGE

TEMPERATURE STABILIZATION BY $H_2$

WAFER SURFACE TEMPERATURE CONTROL FOR DEPOSITION OF THIN FILMS

BACKGROUND OF THE INVENTION

1. Field of the Invention

This invention relates to improving thin films formed on semiconductor wafers. More particularly, it relates to a method and apparatus for improving the characteristics of thin films deposited in a semiconductor processing chamber by improved control and stabilization of wafer surface temperature.

2. Background

The manufacture of semiconductor devices involves depositing layers of various materials on a semiconductor wafer. This is typically done in a deposition chamber of a processing apparatus. Several methods of depositing layers of materials on the wafer exist, such as chemical vapor deposition (CVD), evaporation, epitaxy, and sputtering. Materials deposited may include silicon, silicon dioxide, aluminum, titanium, and titanium nitride.

As chip densities increase and semiconductor processes shrink, the quality of fabrication becomes more crucial. In particular, the composition, structure, and stability of deposited films must be carefully controlled to achieve the desired electrical characteristics and barrier quality. This can be illustrated by considerations relating to the formation of titanium nitride (TiN) thin films in semiconductor wafer processing.

Titanium nitride films can be made by a CVD process, starting with a metallo-organic titanium compound such as $Ti(NR_2)_4$, or tetrakis (dialkylamido) titanium, wherein R is an alkyl group. For example, it is common to use tetrakis (dimethylamido) titanium (TDMAT), which has the formula $Ti(N(CH_3)_2)_4$. This compound readily decomposes to deposit titanium nitride at comparatively low temperatures of 200°–600° C. under vacuum pressures of about 0.1 to 100 Torr. Thus, TDMAT is suitable for thermal deposition of titanium nitride in a CVD chamber, where such temperatures and pressures are typical.

Alternatively, the titanium nitride film may be deposited by reacting the compound with a remotely generated reactive species, such as free radicals from ammonia, nitrogen, hydrogen, or hydrazine. The film may also be deposited in a plasma-enhanced CVD process (PECVD), wherein a plasma is used to drive the reaction and subsequent deposition. This process may be distinguished from the thermal CVD process in that PECVD uses the energy of charged particles from the plasma to initiate the reaction, while the thermal CVD process uses the elevated temperature of the substrate to initiate the reaction.

Thermal CVD deposition of titanium nitride films has the advantage of good deposition rates, good conformality and coverage of stepped features, low defect densities, and the resultant titanium nitride layer has good barrier properties. However, in some processes, such as those using TDMAT, the resistivity of the titanium nitride film is high and unstable, requiring post-deposition processing to reduce and stabilize resistivity, such as plasma bombarding, which is described in U.S. patent application Ser. Nos. 08/339,521 (now abandoned), 08/567,461, and 08/498,990, the disclosures of which is hereby incorporated by reference. In this plasma bombarding process, the film on a wafer is exposed to a plasma environment containing ions. Those ions are then accelerated out of the plasma by an electric or magnetic field to strike the film/wafer surface. These bombarding ions both imbed themselves into the film and/or strike it in an "annealing" type of action. Either or both these events improve the film quality substantially.

Other kinds of processes may be used in conjunction with thermal CVD deposition. Often, as is the case with the plasma bombarding processes described above, the process can be alternated with successive deposition steps in a single CVD deposition chamber. This eliminates the need for wafer transfer from one chamber to another, increasing the reliability and productivity of the manufacturing apparatus and reducing the possibility of particulate contamination.

Such plasma bombarding process may have optimum operating temperatures that differ significantly from wafer surface temperatures ideal for the deposition process. This requires good control of wafer temperature at different process steps under stabilized chamber conditions. Compromise temperature control of wafer surface and chamber conditions adversely affects the quality of the processing. Alternatively, the chamber may be kept at a single temperature which is suboptimal for one or more of the process steps in the chamber.

Thus a need exists for the ability to control the wafer surface temperature independently of the chamber temperature.

Figure 1A:
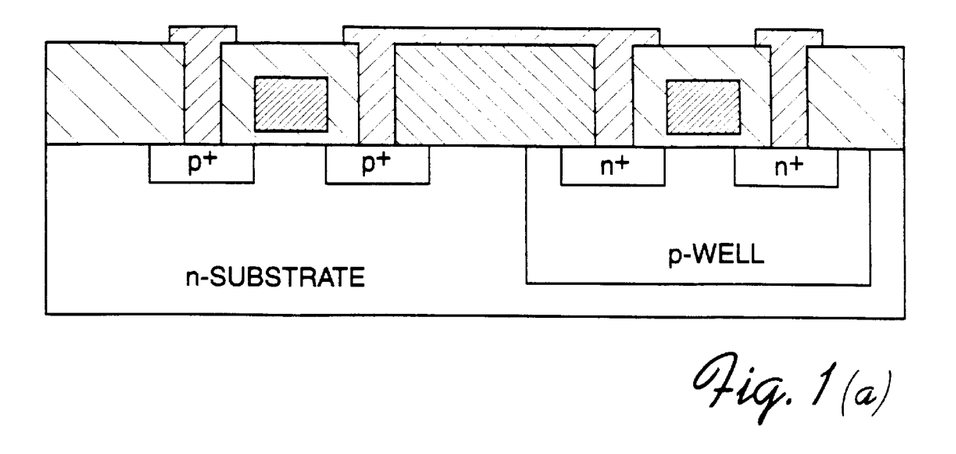
FIGS. 1(a) and 1(b) are sectional views showing idealized and representative cross-sections of a semiconductor device.
Figure 1B:
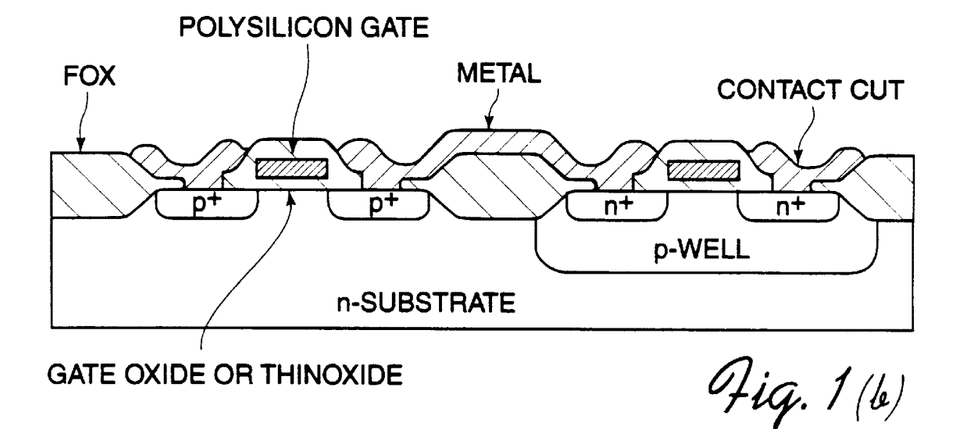

FIGS. 1(a) and (b) depict, respectively, an idealized and a more representative actual cross-section of an integrated circuit. As can be seen from a comparison of FIGS. 1(a) and (b), the features in the actual integrated circuit are not straight or planar. This causes the electrical characteristics of the actual integrated circuit to deviate from the design parameters, and may adversely affect the behavior of the circuit.

Furthermore, because of the stepped surface of the wafer, buildup occurs at the outside corners and upper walls of the trench. This build-up causes overhangs which may close across the trench to form a void at its base. Also, where the spacing between the walls is small (less than, say, $1.6\mu$), the deposited metal layer is thinner at the floor of the trench in the region between the walls. One parameter by which the conformality of the deposited film is measured is bottom step coverage, defined as the ratio of film thickness at the bottom of the via or contact hole, divided by the film thickness at the surface of the wafer. Low bottom step coverage results in overhangs that can cause insufficient filling of the via.

Figure 2A:
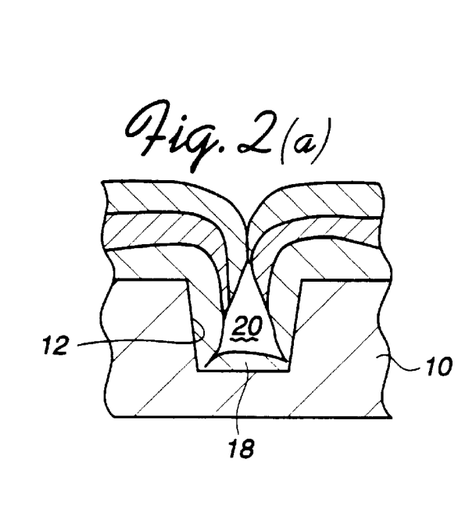
FIG. 2(a) is a sectional view showing deposition of a layer on a substrate having a trench.
Figure 2B:
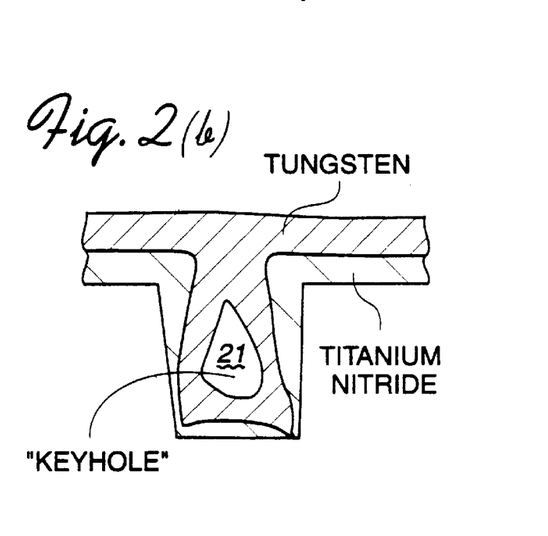
FIG. 2(b) is a sectional view showing metallization of a trench.

This condition is illustrated in FIGS. 2(a) and (b). As shown, a semiconductor wafer 10 has a trench 12 formed in its surface during processing, prior to the deposition of a metal layer. Deposition of material in the trench is nonuniform, and the trench is not filled completely. Instead, the trench has a thin layer of material 18 at its bottom while its upper walls are thicker. As deposition continues, the built-up areas of the walls "grow" toward each other, reducing movement of process gases to the bottom of the trench, which further reduces the deposition of material on the bottom. The built-up areas may eventually come together and close off the unfilled interior of the trench, resulting in the formation of a void 20 in the trench 12, which prevents the filling of the trench with metal during the metallization step. Even if the trench is not closed off by the built-up areas, the poor step coverage may result in the formation of a "key hole" 21 during a subsequent metallization step, as shown in FIG. 2(b).

The problem illustrated in FIGS. 2(a) and (b) are common in PVD processes. The problem may, however, also occur in CVD processes. The rate of deposition in CVD processes is very wafer surface temperature dependent. Typically, the higher the surface temperature, the higher the rate of deposition. In situations where the chamber temperature must be held higher (to accommodate either pre- or post-deposition steps/processes) than ideal for high bottom step coverage in CVD processes, most CVD deposition occurs at the top of the trench or via/hole. This less deposition can occur at the bottom, resulting in the arrangement illustrated in FIGS. 2(a) and (b).

Although lowering the temperature of the wafer to slow the CVD deposition rate does help, this is not always practical because of pre- and post-deposition steps.

Some processes such as the plasma bombarding are sensitive to temperature changes, and the results are very dependent on the temperature of the substrate during processing and pre- and post-deposition process steps can be dominant factors affecting the substrate temperature.

Therefore, there exists a need for a method and apparatus for improved wafer surface temperature control and stabilization in a semiconductor processing apparatus and, in particular, the provision of such control and stabilization without negatively impacting pre- and post-deposition processes.

SUMMARY OF THE INVENTION

This invention relates to improving thin films formed on semiconductor wafers. More particularly, it relates to a method and apparatus for improving the characteristics of thin films deposited in a semiconductor processing chamber by improved control and stabilization of wafer surface temperature.

Briefly, therefore, this invention provides for an apparatus and method for depositing a thin film on a substrate and improving the quality of the deposition by controlling and stabilizing the substrate temperature to maintain it at an optimum level. Further, the invention provides the ability to rapidly change the temperature of the surface of the wafer without need to change the temperature of the chamber.

As described below in terms of a specific example, a substrate in the form of a wafer is placed on a substrate support in a CVD chamber and after the chamber is purged, the chamber and substrate support are brought up to operating temperature using resistive heaters, infrared lamps, or other heating means. A gas with high thermal conductivity, such as helium (He) or hydrogen ($H_2$), is passed over the wafer to cool its surface to a desired temperature for the process to be performed. The flow rate is then adjusted to stabilize the temperature of the wafer surface and reduce surface temperature variations. Processing gases are introduced into the chamber, and deposition onto the wafer commences. The maintenance of correct wafer surface temperature results in improved step coverage and conformality of the deposited film.

In a further extension of the above-described example, the deposition step is followed by a post-processing step such as plasma bombarding. In this case, the process undergoes at a different desired temperature with different process gas combinations. The desired temperature not only enhances the reactivity of the plasma but also provides long term stability of the process.

The deposition step may also be preceded by a pre-deposition step requiring a different temperature from that of the deposition step. A cooling gas compatible with the process is introduced at a flow rate which brings the wafer surface to a desired temperature. The flow rate is adjusted to stabilize the temperature, and the pre-deposition process then commences.

In this manner, multiple processes having different optimum process temperatures may be run in the same chamber without need for changing the temperature of the chamber and substrate support. This minimizes transient time resulting from wafer transfer to another chamber and reduces the potential for contamination during transfer. Additionally, transient time from waiting for the chamber and substrate support temperatures to change and stabilize is reduced.

The invention thus utilizes gases having high thermal conductivity to control wafer surface temperature to enhance CVD and other film formation by providing for improved surface temperature control and stabilization while allowing multiple processes to be run in the same chamber.

DESCRIPTION OF THE DRAWINGS

In the accompanying drawings.

DETAILED DESCRIPTION

Overview

In overview, this invention is based on the use of gases with high thermal conductivities such as hydrogen or helium, to reduce or otherwise control the surface temperature of a wafer shortly before thermal CVD processing. The flow of a cooling gas such as hydrogen is used to control and stabilize the temperature of the wafer surface to maintain it at a temperature desired for the process being run. The present invention thus provides for localized temperature control of the wafer, with attendant benefits in reduced transient time, improved bottom step coverage and conformality of deposition, and improved processing results from pre- and post-deposition processes.

The present invention may be used to provide localized wafer temperature control, for whatever reason, in an environment that must remain at an elevated temperature. The cooling gas and the flow rate may also be changed to accommodate a different process in the same chamber, and thus, multiple consecutive processes may be run in a single chamber at different wafer surface temperatures for each process. Transient time required for wafer transfer to different chambers or to change the temperature of the chamber is minimized, and processes are able to be run at optimum temperatures to achieve improved results. Additionally, because multiple processes may be run in a single chamber, the particulate contamination that often attends wafer transfer between chambers is reduced.

The present invention will now be illustrated by its application in a thermal CVD processing apparatus, but it should be understood that the principles and methods of this invention may be applied in other types of processing where control of wafer surface temperature is desirable.

Apparatus

FIGS. 3(a), 3(b), 4, and 5 illustrate, in greater detail, several examples of a CVD apparatus in an embodiment of the invention.

Figure 3A:
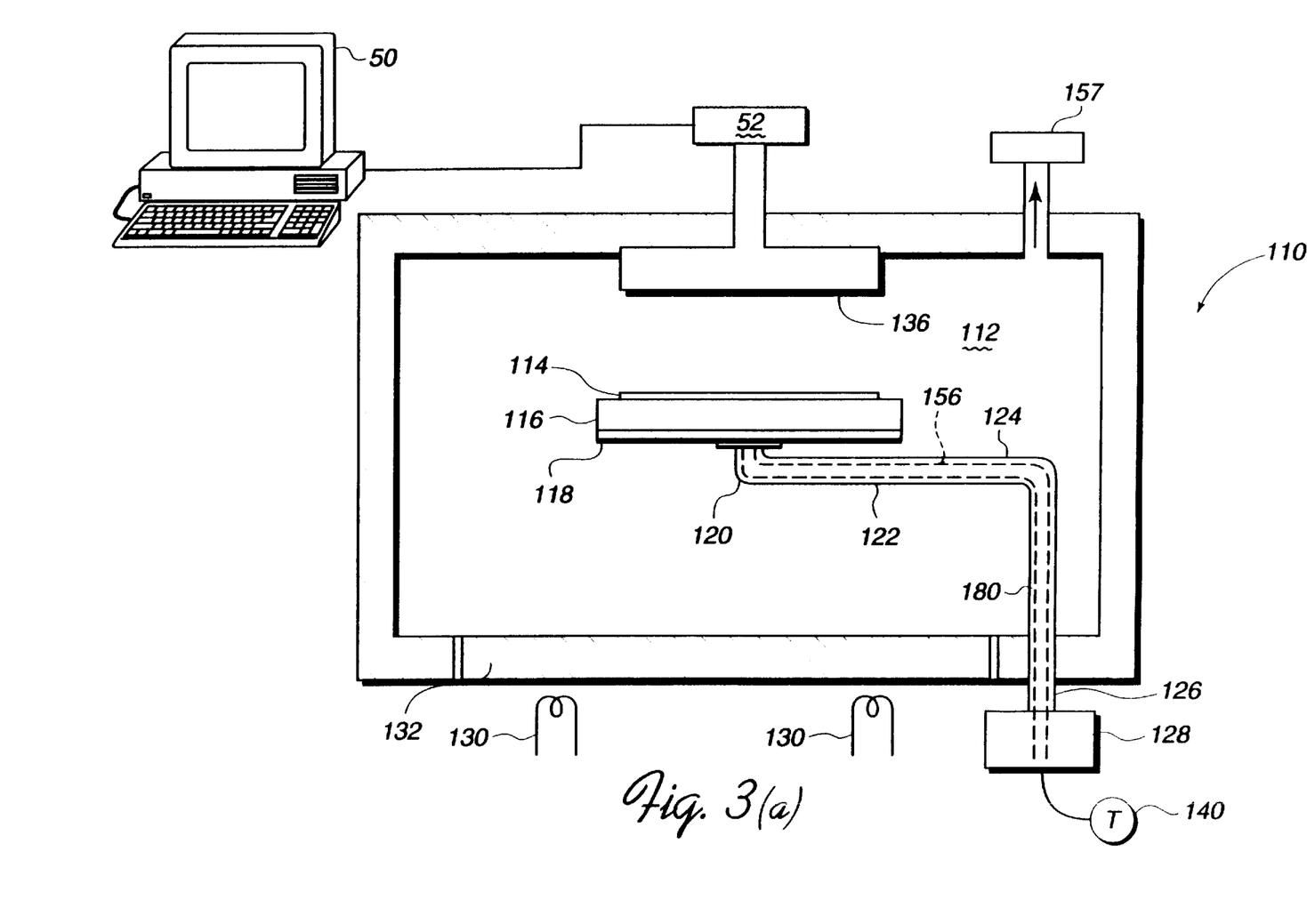
FIG. 3(a) is a schematic illustration of a processing chamber in accordance with the invention.

As shown in FIG. 3(a), a semiconductor wafer processing apparatus 110 includes a processing chamber 112. A semiconductor wafer 114 is supported in this chamber on an anodized aluminum susceptor 116 which in turn is supported by a conventional alumina ceramic support plate 118. The combination of support plate 118, susceptor 116 and wafer 114 is supported on the free end 120 of a cantilevered alumina support arm 122. The fixed end 124 of the support arm 122 is mounted to a generally vertically moveable stem 126 which in turn is vertically displaceable under action of a displacement mechanism 128. The chamber 112 and its contents are heated by means of conventional lamps 130 which irradiate the interior of the chamber 112 through a conventional quartz window 132, but a resistively heated substrate support (not shown) may also be used. The apparatus 110 further includes a temperature determination means 140 which senses the temperature of the susceptor or heater pedestal (and thereby determines the wafer temperature) in a conventional manner.

In addition, a vacuum pump 157 is used to reduce the pressure within the chamber 112. A showerhead 136 is placed above the susceptor 116. The showerhead is supplied with purge, cooling, and processing fluids, generally in gaseous form, from a gas panel 52 which is controlled by a gas controller 50 in the form of a computer.

Referring back to FIG. 3(a), the gas panel controller 50 causes the gas panel 52 to supply purge gas to the chamber 112 through the showerhead 136. Thereafter, in terms of the invention, the gas panel controller 50 causes the gas panel 52 to supply cooling gas such as hydrogen or helium to the showerhead 136. These gases are exhausted from the chamber 112 by means of the pump 157. During CVD operations, the process gas, which carries a film forming precursor gas such as TDMAT, is introduced into the chamber 112 through the showerhead 136 and transported to the heated wafer 114. This results in the deposition of a thin film of material on the upper surface of the wafer 114. The carrier gas with the deposition by-products is exhausted from the chamber by means of the pump 157.

If further processing operations at a different wafer surface temperature are required, the gas panel controller 50 causes the gas panel 52 to supply the necessary flow and type of cooling gas to the showerhead 136. Thereafter, the flow is adjusted to maintain the desired temperature and further processing gases are supplied to the showerhead 136. For example, plasma bombarding may be alternated with deposition in the apparatus of FIG. 3(b).

Figure 3B:
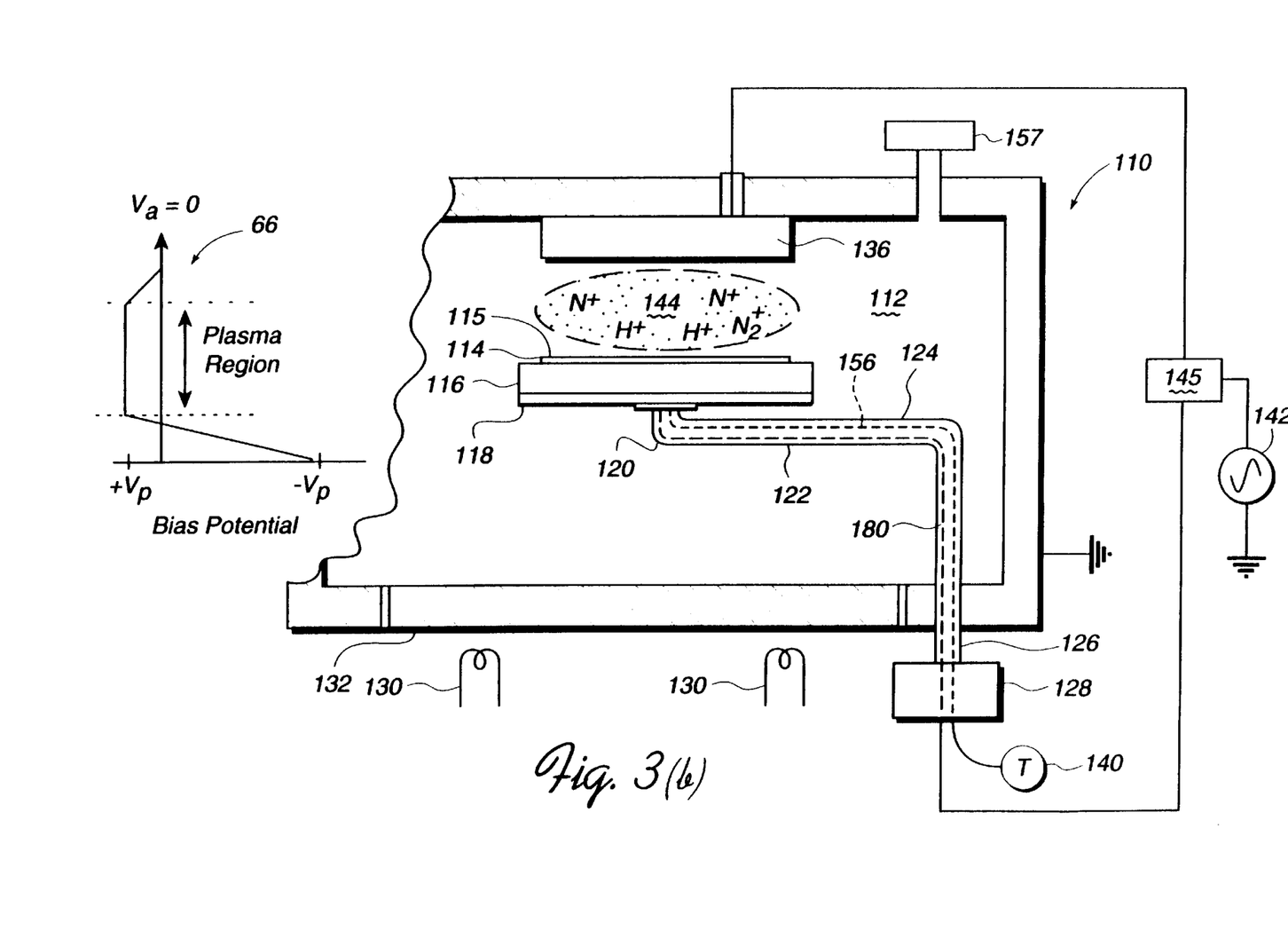
FIG. 3(b) is a schematic illustration of another processing chamber in accordance with the invention.

The apparatus of FIG. 3(b) is similar to the apparatus of FIG. 3(a), with some modifications for use with plasma. The processing chamber 112 is connected to ground, and the showerhead 136 is electrically isolated from the chamber 112 by means of an isolator (not shown). The showerhead 136 and the susceptor 116 are electrically connected to an rf source 142 through a matching network 145 which also splits power between the two. Further details of this apparatus may be discerned from U.S. patent application Ser. Nos. 08/567,461 and 08/498,990, referenced above.

After deposition ends and before plasma bombarding of the deposited film begins, the flows and types of gases may be adjusted to allow the temperature of the wafer 114 to rise to an optimum temperature for the plasma bombarding process. Once the desired wafer surface temperature has been reached, the flow of cooling gas is adjusted to maintain the wafer 114 at a constant temperature, and plasma bombarding commences. During plasma bombarding, a plasma gas, such as a combination of nitrogen, hydrogen, argon and other noble gases is supplied to the showerhead 136 by the gas panel 52 under control of the gas panel controller 50.

Figure 3C:
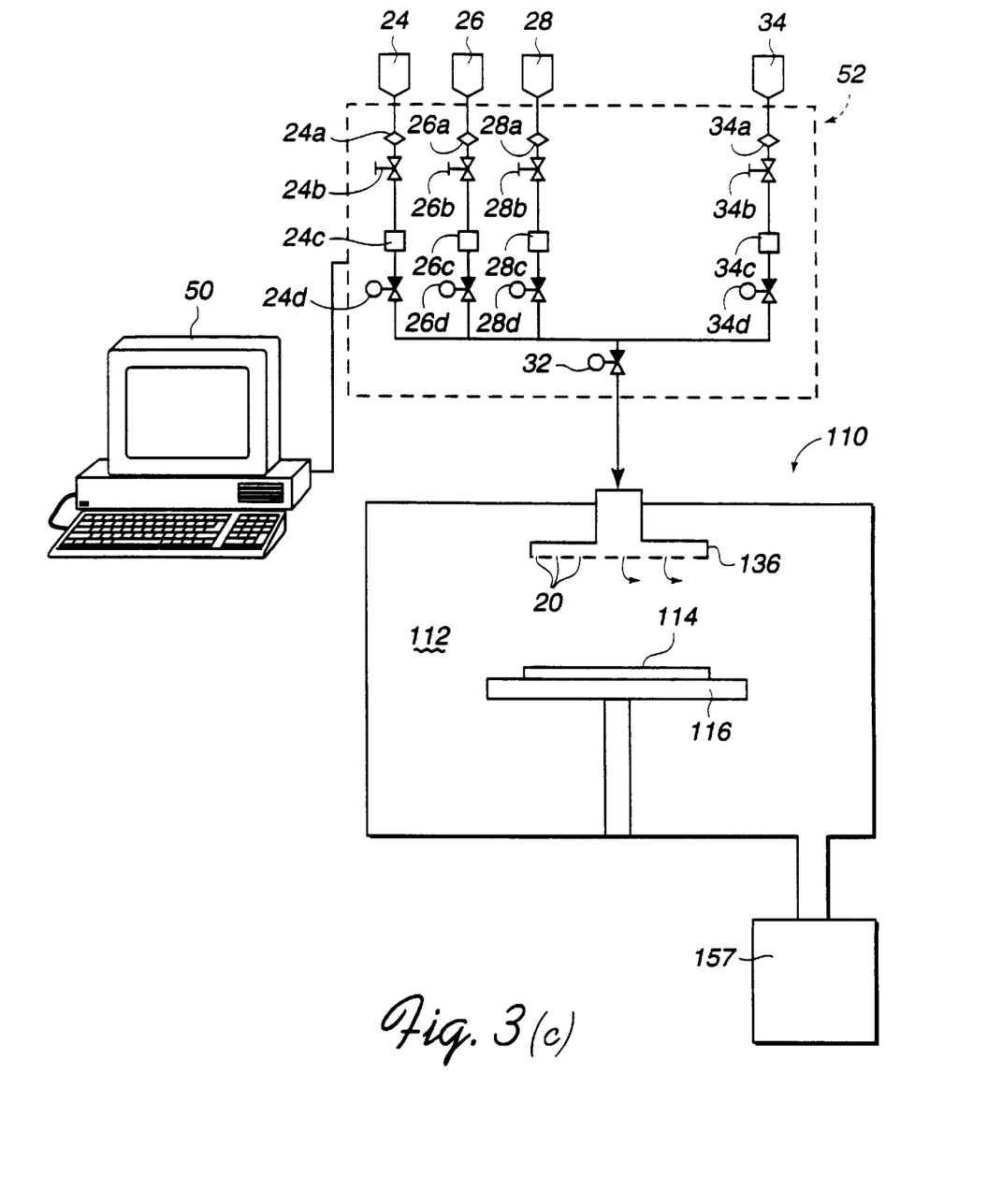
FIG. 3(c) is a schematic illustration of a gas panel and a gas chamber.

FIG. 3(c) shows the gas panel 52 in more detail, in conjunction with a slightly different processing chamber 112. The gas panel 52 includes several supplies for gases used in the operation of the reactor 110. Although the figure shows four gas supplies 24, 26, 28, and 34, any number of gas supplies may be used, to supply desired gases such as argon, chlorine, helium, hydrogen, nitrogen, silane, and TDMAT. The process gases may be mixed with carrier gases such as hydrogen, helium, argon, or nitrogen. The gas panel controller 50 is connected to the gas panel 52 and actuates pneumatic normally-closed (NC) valves to turn their respective gas flows on and off.

A gas, such as helium, is supplied from the gas supply 24 through a filter 24a and a manually operated valve 24b to a mass flow controller 24c. The gas then passes through a pneumatic NC valve 24d which is controlled by the gas panel controller 50 and permits flow only in the direction of the chamber 112. The gas enters the chamber through holes 20 in the showerhead 136. Other gases are supplied from other gas supplies 26, 28, and 34, in a similar fashion. The flow of gases from the gas panel 52 may be shut off by the valve 32.

To further improve the thin film, deposition may be cycled with plasma bombarding. The flow of high thermal conductive gases may then be adjusted to result in the optimum wafer surface temperature for the deposition process as described above. Thus, the film can be built up from successively deposited and plasma bombarded sub-films.

Method of Use

By way of non-limiting example, the method of this invention and the use of this apparatus will be illustrated by the thermal CVD deposition of a titanium nitride film, and the post-deposition plasma treatment of the deposited film with an rf nitrogen/hydrogen plasma to reduce its resistivity and improve its chemical stability. This process will hereinafter be referred to as the CVD TiNxP process, and a suitable apparatus for carrying out this process is the Applied Materials Precision 5000. Also suitable is the Applied Materials Centura, or Endura Chambers. It will be readily apparent to one skilled in the art, however, that this invention is equally appropriate for other equipment and other types of processes, performed as single processes in dedicated chambers or multiple processes in a single chamber or multiple processes in multiple chambers.

Figure 4:
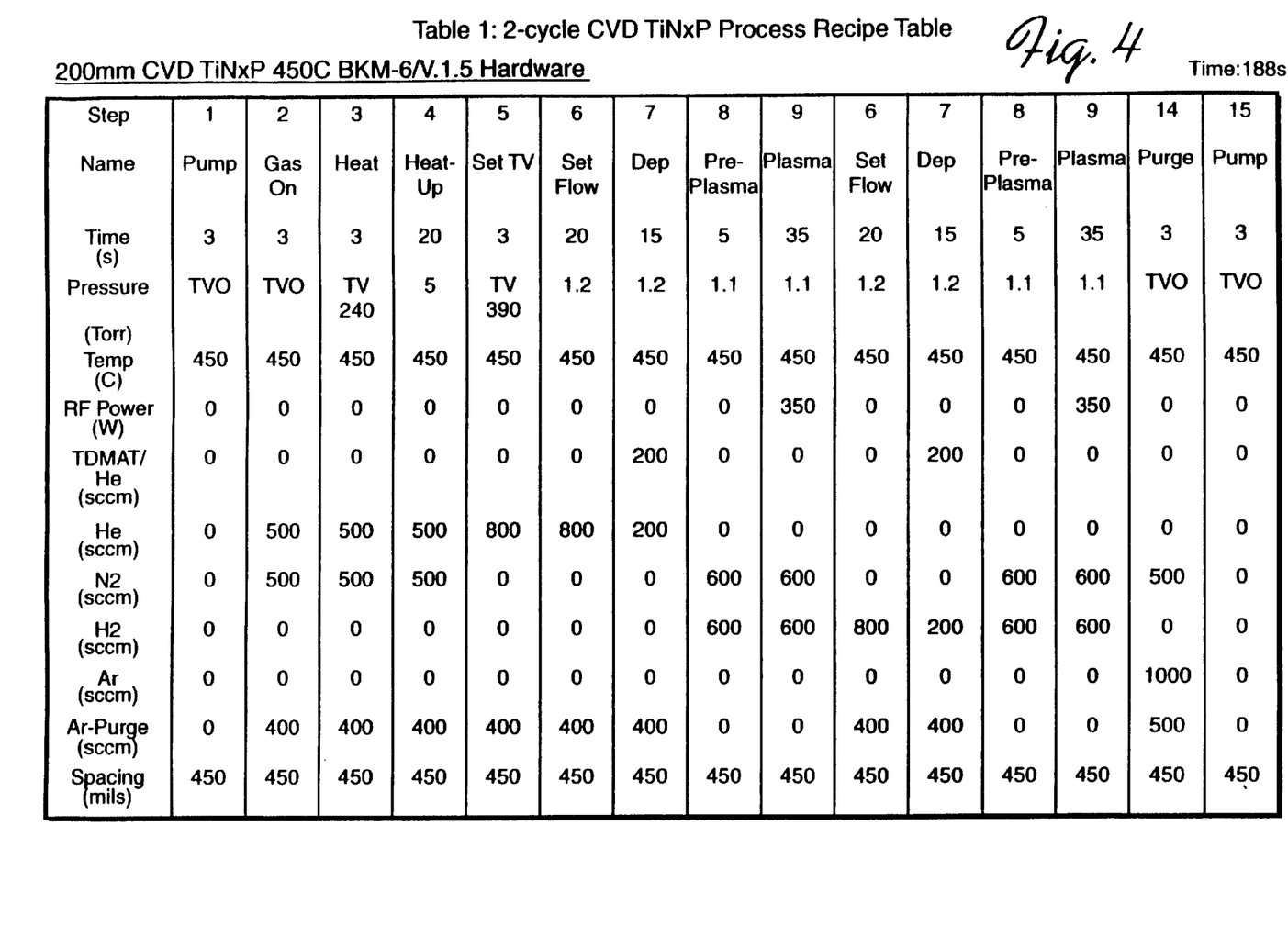
FIG. 4 is a process recipe table for a 2-cycle CVD TiN deposition alternated with plasma bombarding.
Figure 5:
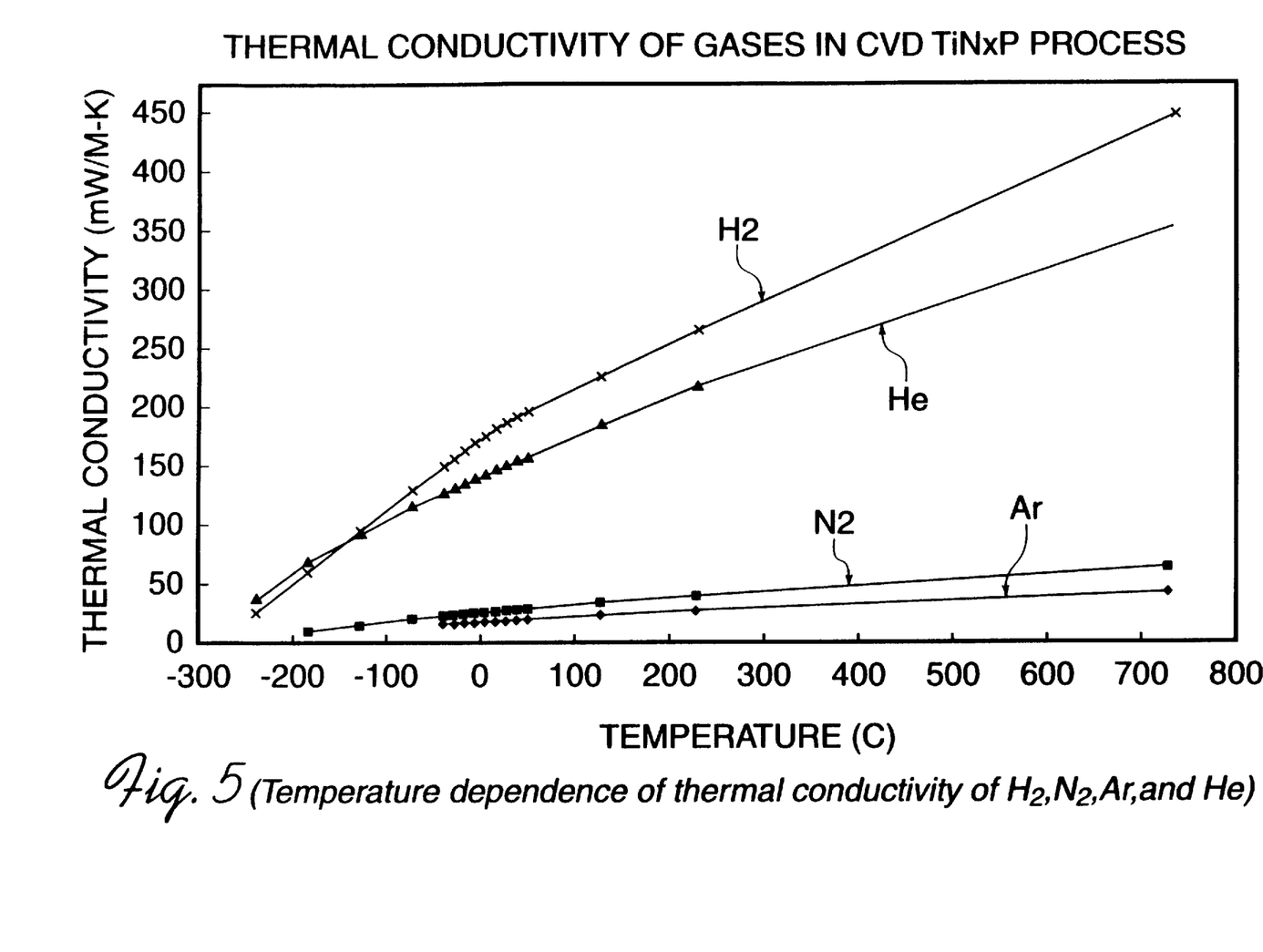
FIG. 5 is a graph indicating the thermal conductivities of various gases as a function of temperature.

FIG. 4 shows a process recipe table for a 2-cycle CVD TiN process with plasma bombarding. In a standard 8 inch wafer process, a wafer 114 is transferred into the chamber 112 by a wafer transfer blade (not shown) as is usual in processing apparatuses. The chamber 112 is purged in a conventional fashion with purge gases such as argon, nitrogen, and helium. The chamber 112 and susceptor 116 are heated to 450° C. This is the temperature typically required for the later plasma bombarding step. The gas panel controller 50 then activates the gas panel 52 to supply helium (He) gas at 800 sccm to bring the wafer surface temperature down to 350°–370° C. Argon purge gas is supplied to the chamber 112 at 400 sccm. When the desired temperature is reached, the flow of helium is reduced to 200 sccm, and TDMAT with helium carrier gas is introduced at a flow rate of 200 sccm. When the TDMAT comes into contact with the heated wafer surface, it decomposes to deposit titanium nitride on the wafer 114.

At the end of deposition, the gas panel controller 50 turns off the helium and argon gas flows and begins supplying hydrogen gas at 600 sccm, along with nitrogen gas at 600 sccm. The temperature of the surface of the wafer 114 is allowed to rise to 390°–410° C. These gases are also used for the plasma ignition, and plasma bombardment of the deposited layer is initiated by activating the rf power source 142 to supply rf power to the showerhead 136 and the susceptor 116.

After the plasma bombarding is completed, the flow of hydrogen or helium gas is increased to 800 sccm and argon purge gas is supplied at 400 sccm. The wafer surface temperature is reduced to 350°–370° C. as before. During deposition, the flow of hydrogen gas is reduced to 200 sccm to maintain the wafer surface temperature and TDMAT is introduced with helium carrier gas at 200 sccm. When the deposition has finished, the gas panel controller 50 increases the flow of hydrogen to 600 sccm, causes nitrogen to flow at 600 sccm, and shuts off the flow of argon and/or helium. The wafer surface temperature is increased to 390°–400° C. Plasma bombarding then commences. These process deposition and/plasma bombarding steps are then repeatedly cycled after which the chamber 112 is purged and the wafer 114 is removed. During all steps, the susceptor temperature remains at 450° C., plus or minus about 2 degrees, even through the wafer surface temperature changes much more due to the cooling effect of gas flow.

It is apparent from the foregoing that the method of the invention may be used to hold the wafer surface temperature at a temperature desirable for the process being performed. It should also be apparent that many variations in gas types and flows are possible. For example, nitrogen might be used as the cooling gas, although helium and hydrogen gas are preferred because of their high thermal conductivities. The thermal conductivities of hydrogen, helium, nitrogen, and argon are graphically illustrated in FIG. 5.

Figure 6A:
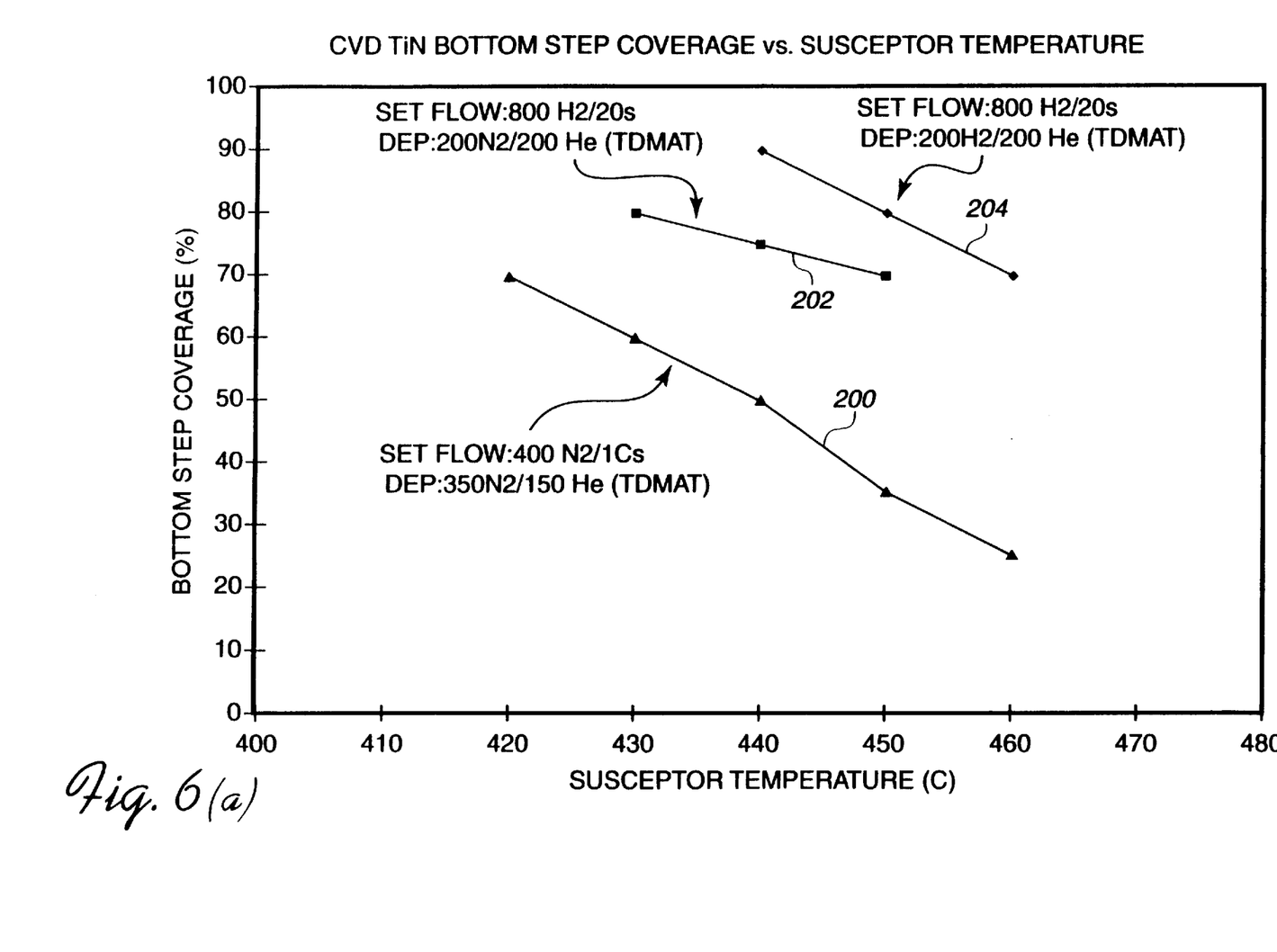
FIG. 6(a) is a graph of different bottom step coverages versus susceptor temperature.

Shown in FIG. 6(a) is a graph indicating the bottom step coverage as a function of susceptor temperature, in a CVD TiNxP process on a wafer with 0.4–0.5 μm contact/via holes having aspect ratios (ratio of depth to width) of 2 to 3. Three lines are plotted, the first of which (line 200) represents a flow of 400 sccm nitrogen gas for 10 seconds prior to deposition followed by TDMAT deposition together with a 350 sccm nitrogen and 150 sccm helium flow. The second and third lines 202, 204 respectively show improvements to that represented by the first line 200. Line 202 represents a process using a 20 second, predeposition flow of 800 sccm hydrogen followed by deposition with 200 sccm nitrogen and 200 sccm helium. The third, and best result, shown by line 204 represents a process using a 20 second, predeposition flow of 800 sccm hydrogen followed by deposition in conjunction with 200 sccm hydrogen and 200 sccm helium.

As can be seen from FIG. 6(a), in the prior art process as indicated by reference numeral 200, step coverage of the via drops dramatically as the temperature of the susceptor increases. If it is desired to run another process in the same chamber which has a high optimum temperature, such as plasma bombarding, prior art methods may therefore force one to sacrifice step coverage in order to obtain good results from the other process. For example, it has been found that for the CVD TiNxP process, process stability can be achieved with a susceptor temperature of 450°–460° C. However, within this temperature range, the bottom step coverage of the film ranges from 25% to 45%. If the susceptor temperature is reduced to 420° C. in order to increase step coverage to 70–75%, the plasma process cannot be stabilized.

Figure 6B:
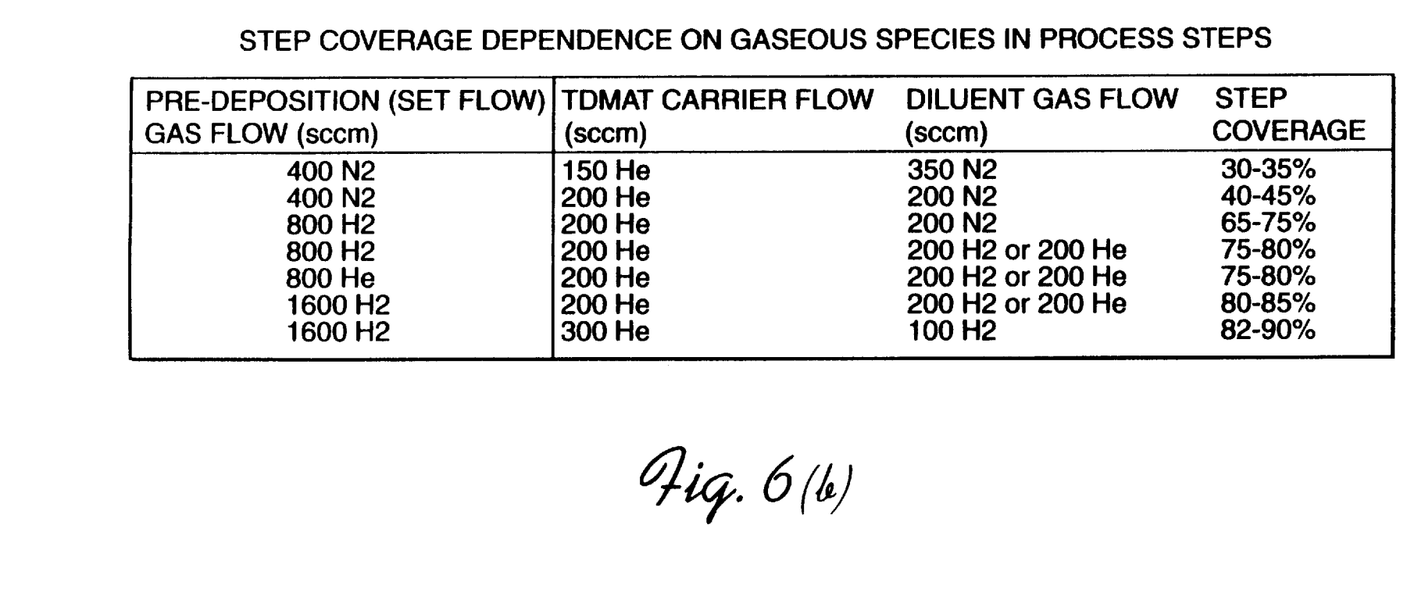
FIG. 6(b) is a table showing the dependence of step coverage on the use of different carrier and diluent gas flow rates and gas species.
Figure 7:
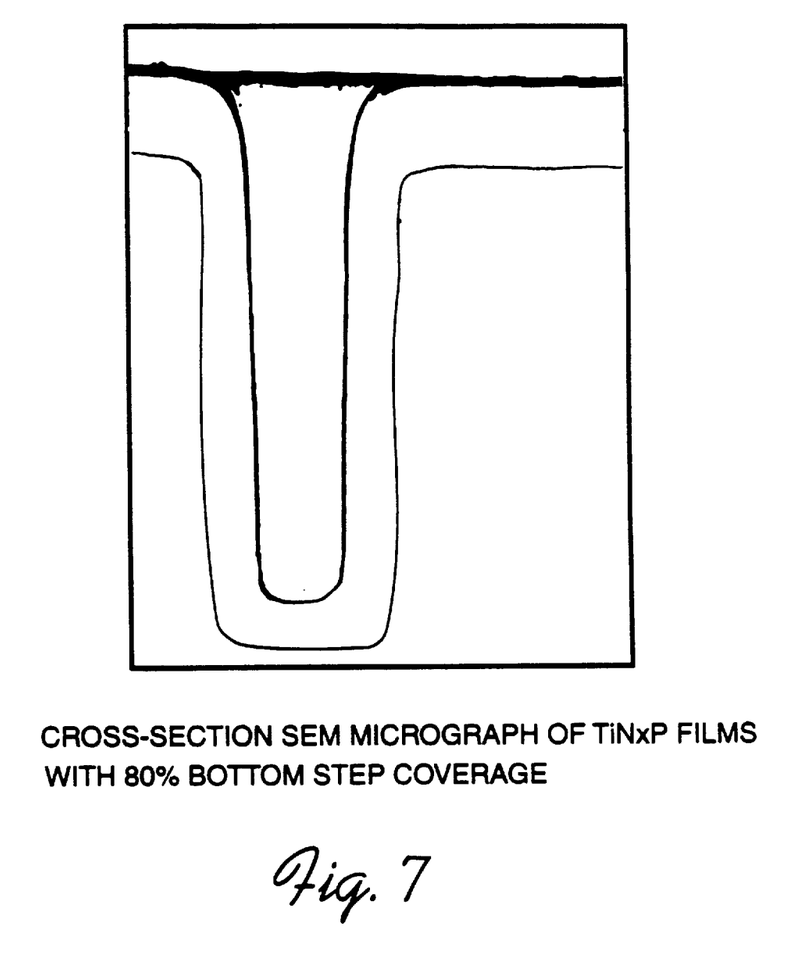
FIG. 7 is a gross-section of a via showing the improved bottom step coverage resulting from the use of this invention.

In contrast in the process of the invention using gases with higher thermal conductivities to cool wafer surface temperature, with He or $H_2$ in the pre-deposition step and $N_2$ as the diluent gas in the deposition step, even with a 450° C. susceptor temperature, where the step coverage is about 70%. If the process is run with $H_2$ or He as the diluent gas in the deposition step, the step coverage is above 80% at a susceptor temperature of 450° C. FIG. 6(b) is a table showing the step coverage achieved with various gases and flow rates. As can be seen from the table, the greatest step coverage is achieved with 1600 sccm of hydrogen during the pre-deposition step, and 300 sccm of helium as a carrier gas and 100 sccm of hydrogen as a diluent during the deposition. These improvements are due to the ability to hold the temperature of the wafer surface at a temperature different from the susceptor temperature. The high step coverage and highly conformal coverage of the corners between the bottom and walls of the contact/via hole are shown by FIG. 7, which is an SEM (Scanning Electron Microscope) micrograph of a CVD TiNxP film deposited using the wafer surface temperature control process of the invention, in which 80% step coverage was achieved.

Figure 8A:
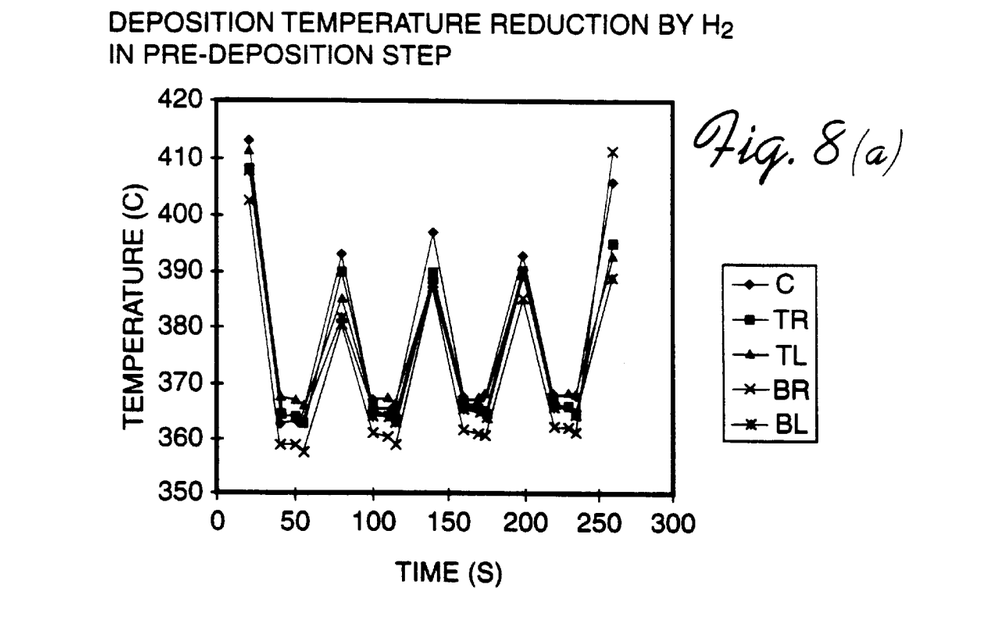
FIGS. 8(a) and (b) are graphs showing the changes in wafer surface temperature during a typical process using the method of the invention.
Figure 8B:
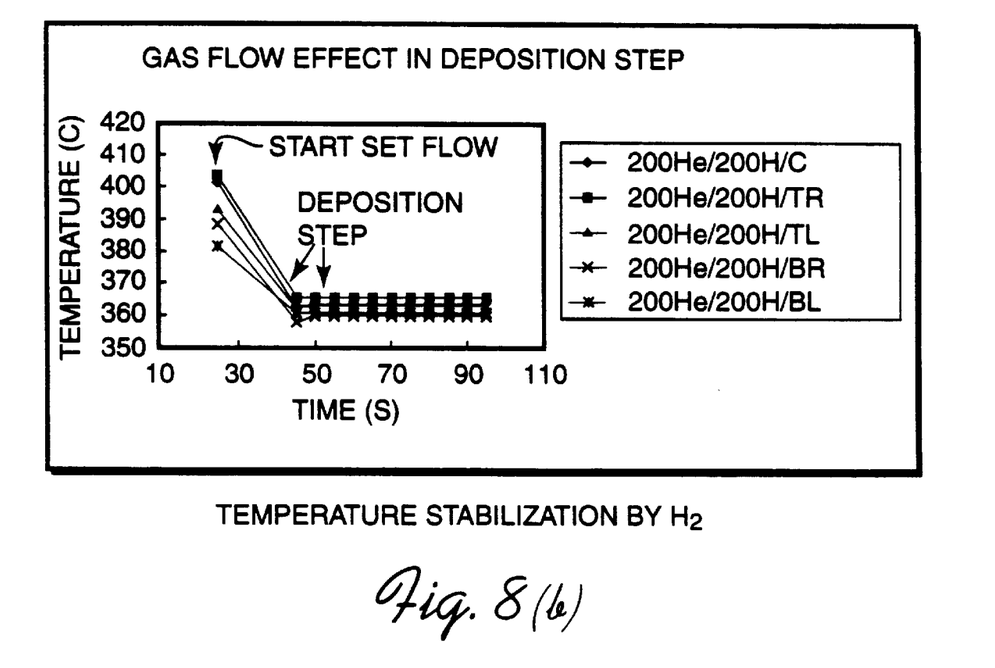

FIG. 8(a) shows the cycling of the wafer surface temperature using high thermal conductivity gases such as hydrogen and helium, in accordance with the invention. The valleys are the temperatures during the deposition steps, while the peaks are the temperatures during the plasma bombarding steps. As indicated by the graphs in FIG. 8(a) and (b), the use of high thermal conductivity cooling gas reduces the surface temperature by about 25°–30° C., to 355°–365° C., and stabilizes the surface temperature to within 1° C. over the time period shown. Wafer surface temperature measurements were taken at the center (C), top right (TR), top left (TL), bottom right (BR), and bottom left (BL) of the wafer surface. Temperature variation was within 5° C. across the surface of the wafer.

The relatively low, uniform, and stable wafer surface temperature results in improved step coverage during deposition. This is due to the kinetics of the chemical vapor deposition and the fact that the rate of reaction increases with temperature. At high temperatures, the process gases react rapidly and deposit most of the material at the surface and upper region of the contact/via hole. By the time the gases reach the bottom of the hole, the precursor gas is largely depleted and relatively little deposition occurs at the bottom. The use of cooling gas to reduce the temperature at the surface of the wafer reduces the rate of reaction of the process gases at the upper region of the hole, and results in greater material transport flux at the bottom of the hole. In fact, this may produce better step coverage than simply reducing the temperature of the susceptor, as a larger thermal gradient is produced between the upper and lower portions of the wafer, increasing the rate of reaction at the bottom.

Figure 9:
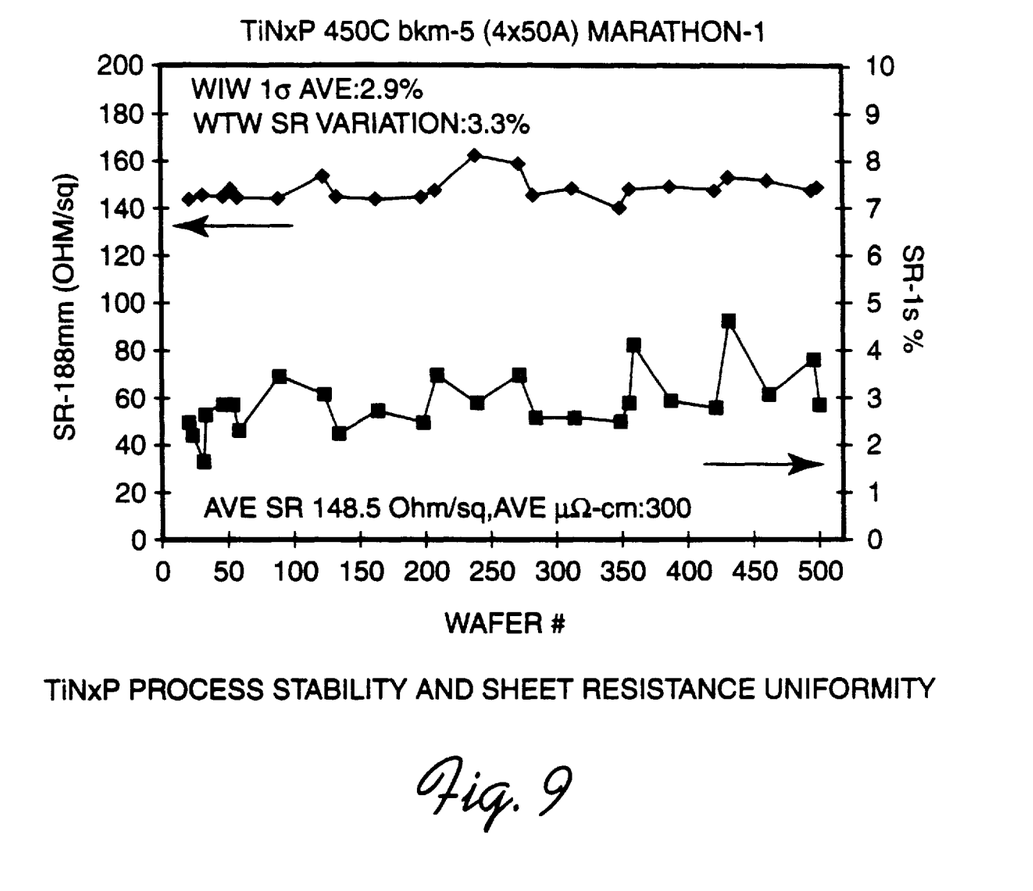
FIG. 9 is a graph showing the process stability over a large number of wafers.

The improvement of titanium nitride films thus achieved by the present invention may be seen from the graph in FIG. 9, which shows the results of a 500 wafer batch in which titanium nitride films 200 angstroms thick were deposited. The on-wafer sheet resistivity ranges from 250–350 $\mu\Omega$-cm, while the on-wafer sheet resistance nonuniformity ranges from 2–3.5%, and the wafer-to-wafer sheet resistance variation is approximately 3% (1 sigma).

As may be seen from the foregoing, the application of the present invention in the CVD TiNxP process results in improved deposition temperature stability, step coverage, on-wafer uniformity, and wafer-to-wafer reproducibility. The quality of semiconductor fabrication is thus increased, and this process may be used in the manufacture of sub-0.35 $\mu$m integrated circuits. More generally, the wafer surface temperature control of the present invention may be used in any process where it is desirable to control the wafer surface temperature in order to achieve good process results. The present invention may further be used in applications utilizing multiple processes which have different optimum temperatures, to hold the wafer surface temperature at various levels depending on the process being run.

This invention, therefore, has the advantage of providing the opportunity in which multiple processes having different optimum process temperatures may be run in the same chamber without need for changing the temperature of the chamber and substrate support. This minimizes transient time resulting from wafer transfer to another chamber and reduces the potential for contamination during transfer. Additionally, transient time from waiting for the chamber and substrate support temperatures to change and stabilize is reduced.

Conclusion

While this invention has been described in terms of plasma bombarding of CVD-deposited films, it will be obvious to one skilled in the art that this invention has applicability to any process in which it is desirable to control the wafer surface temperature.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of processing a substrate in a chamber comprising the sequential steps of:
    (a) heating the chamber to a first temperature;
    (b) flowing a cooling gas over a surface of the substrate to cool the surface to a second temperature which is suitable for deposition of a material on the surface and which is less than the first temperature;
    (c) causing said material to be deposited on the cooled surface;
    (d) allowing the temperature of the surface of the substrate to increase above the second temperature to a third temperature; and
    (e) annealing the deposited material at the third temperature by bombarding the deposited material with particles originating from a plasma.

2. The method of claim 1, further comprising the step of:
    (a) adjusting the flow of the cooling gas to maintain the temperature of the surface of the substrate at the second temperature for a predetermined time.

3. The method as recited in claim 1, wherein the third temperature is less than or equal to the first temperature.

4. The method of claim 3, wherein the first temperature is high enough to support a stable plasma.

5. The method as recited in claim 1, wherein the cooling gas is one or more of the group consisting of hydrogen, nitrogen, and noble gases.

6. The method as recited in claim 1, wherein the step of causing a material to be deposited is performed by chemical vapor deposition.

7. A method for increasing step coverage of a trench in an upper surface of a substrate in a chamber at a chamber temperature, comprising the steps of:
    (a) using a cooling gas to cool the upper surface of the substrate from the chamber temperature to a lower temperature; and
    (b) depositing a layer in the trench and on the upper surface of the substrate with the upper surface at said lower temperature such that a ratio of the deposition rate of the layer in the trench relative to the deposition rate of the layer on the upper surface is greater than ratios of deposition rates of the layer in the trench to deposition rates of the layer on the upper surface at upper surface temperatures greater than the lower temperature.

8. The method as recited in claim 7, wherein the cooling gas is one or more of the group consisting of hydrogen, nitrogen, and noble gases.

9. The method as recited in claim 7, further comprising the step of adjusting a flow of the cooling gas to maintain the temperature of the upper surface of the substrate at the lower temperature for a predetermined time.

10. The method as recited in claim 7, wherein the step of depositing the layer is performed by chemical vapor deposition.

11. A method of decreasing a cycle time in a semiconductor manufacturing cycle, the cycle having steps that are performed on a substrate in a chamber at a chamber temperature, comprising the sequential steps of:
    (a) performing a first step of the cycle on a surface of the substrate at a first temperature that is substantially equal to the chamber temperature;
    (b) flowing a cooling gas over the surface of the substrate to cool the surface to a second temperature while maintaining a susceptor upon which the substrate is supported at a temperature that is substantially equal to the chamber temperature;
    (c) performing a second step of the cycle comprising depositing a material on the cooled surface of the substrate at the second temperature;
    (d) annealing the deposited material at a third temperature by bombarding the deposited material with particles originating from a plasma, the third temperature being less than or equal to the chamber temperature; and
    (e) performing one or more remaining steps to complete the cycle.

12. The method as recited in claim 11, wherein the cooling gas is one or more of the group consisting of hydrogen, nitrogen, and noble gases.

13. The method as recited in claim 11, further comprising the step of adjusting the flow of the cooling gas to maintain the temperature of the surface at the second temperature for a predetermined time.

14. The method as recited in claim 11, wherein at least one of the steps is performed by chemical vapor deposition.

* * * * *